United States Patent
Huang et al.

(10) Patent No.: US 9,184,256 B2
(45) Date of Patent: Nov. 10, 2015

(54) MOS VARACTOR OPTIMIZED LAYOUT AND METHODS

(71) Applicant: Taiwan Semiconductor Manufacturing Company, Ltd., Hsin-Chu (TW)

(72) Inventors: Chi-Feng Huang, Zhubei (TW); Chia-Chung Chen, Keelung (TW)

(73) Assignee: Taiwan Semiconductor Manufacturing Company, Ltd., Hsin-Chu (TW)

( * ) Notice: Subject to any disclaimer, the term of this patent is extended or adjusted under 35 U.S.C. 154(b) by 11 days.

(21) Appl. No.: 14/263,744

(22) Filed: Apr. 28, 2014

(65) Prior Publication Data

US 2014/0239364 A1 Aug. 28, 2014

Related U.S. Application Data

(60) Continuation of application No. 13/900,423, filed on May 22, 2013, now Pat. No. 8,735,257, which is a division of application No. 13/013,677, filed on Jan. 25, 2011, now Pat. No. 8,450,827.

(51) Int. Cl.
*H01L 27/088* (2006.01)
*H01L 29/66* (2006.01)
(Continued)

(52) U.S. Cl.
CPC .......... *H01L 29/66174* (2013.01); *H01L 29/93* (2013.01); *H01L 29/94* (2013.01); *H01L 27/0808* (2013.01); *H01L 27/0811* (2013.01)

(58) Field of Classification Search
CPC .............. H01L 29/66174; H01L 29/93; H01L 27/0808
See application file for complete search history.

(56) References Cited

U.S. PATENT DOCUMENTS 4,048,519 A * 9/1977 Hoffmann et al. ............... 377/58
4,281,399 A * 7/1981 Yamamoto ..................... 365/203
(Continued)

FOREIGN PATENT DOCUMENTS

TW 247362 1/2006

OTHER PUBLICATIONS

Ho, W. T., et al., "Fully-Differential 13 Gbps Clock Recovery Circuit for OC-255 SONET Applications," IEEE International Symposium on Circuits and Systems, ISCAS 2005, vol. 5, pp. 4879-4882.

(Continued)

*Primary Examiner* — Thanh V Pham
(74) *Attorney, Agent, or Firm* — Slater & Matsil, L.L.P.

(57) ABSTRACT

Apparatus and methods for a MOS varactor structure are disclosed. An apparatus is provided, comprising an active area defined in a portion of a semiconductor substrate; a doped well region in the active area extending into the semiconductor substrate; at least two gate structures disposed in parallel over the doped well region; source and drain regions disposed in the well region formed on opposing sides of the gate structures; a gate connector formed in a first metal layer overlying the at least two gate structures and electrically coupling the at least two gate structures; source and drain connectors formed in a second metal layer and electrically coupled to the source and drain regions; and interlevel dielectric material separating the source and drain connectors in the second metal layer from the gate connector formed in the first metal layer. Methods for forming the structure are disclosed.

20 Claims, 18 Drawing Sheets

(51) Int. Cl.
  *H01L 29/93* (2006.01)
  *H01L 29/94* (2006.01)
  *H01L 27/08* (2006.01)

(56) References Cited

U.S. PATENT DOCUMENTS

| | | | | |
|---|---|---|---|---|
| 4,565,933 | A | * | 1/1986 | Frieling .......................... 327/136 |
| 5,200,751 | A | * | 4/1993 | Smith ............................. 341/147 |
| 7,053,465 | B2 | | 5/2006 | Benaissa et al. |
| 2009/0250739 | A1 | | 10/2009 | Johnson et al. |
| 2011/0204969 | A1 | | 8/2011 | Chen et al. |

OTHER PUBLICATIONS

Moon, H., et al., "A Fully Differential LC-VCO Using a New Varactor Control Structure," IEEE Microwave and Wireless Components Letters, vol. 14, No. 9, Sep. 2004, pp. 410-412.

Wolf, "Silicon Processing for the VLSI Era", vol. 1, The Prologue, 1986.

Wong, W. M. Y., "A Wide Tuning Range Gated Varactor," IEEE Journal of Solid-State Circuits, vol. 35, No. 5, May 2000, pp. 773-779.

Wong, W., et al., "Wide Tuning Range Inversion-Mode Gated Varactor and Its Application on a 2-GHz VCO," 1999 Syposium on VLSI Circuits Digest of Technical Papers, pp. 53-54.

* cited by examiner

MOS VARACTOR OPTIMIZED LAYOUT AND METHODS

PRIORITY CLAIM

This application is a continuation of, and claims the benefit of U.S. patent application Ser. No. 13/900,423, filed on May 22, 2013, titled "MOS Varactor Optimized Layout and Methods," which application is hereby incorporated herein by reference, which is a divisional of U.S. patent application Ser. No. 13/013,677, filed on Jan. 25, 2011, titled "MOS Varactor Structure and Methods," now U.S. Pat. No. 8,450,827, issued May 28, 2013, which application is hereby incorporated herein by reference.

BACKGROUND

A common requirement for an advanced electronic circuit and particularly for circuits manufactured as integrated circuits ("ICs") in semiconductor processes is the use of varactors. Varactors or "variable reactors" provide a voltage controlled capacitor element that has a variable capacitance based on the voltage expressed at the terminals and a control voltage. Metal oxide semiconductor or MOS varactors may have a control voltage applied to a gate terminal that provides a control on the capacitance obtained for a particular voltage on the remaining terminals of the device.

Because a varactor is based on a reverse biased P-N junction, the terminals are typically biased such that no current flows across the junction. A circuit element structure where no current flows between the terminals provides, in essence, a capacitor. However, by varying the bias on the third terminal (the "gate" for a MOS varactor), the device may form a depletion or even an accumulation region under the gate, changing the current flow through the device. The effective capacitance obtained is thus variable, and, voltage dependent. This makes the varactor very useful as a voltage controlled capacitor. This circuit element is particularly useful in oscillators, RF circuits, mixed signal circuits and the like.

The capacitance obtained at a given control voltage for a varactor is dependent on physical quantities including the gate oxide thickness ("Tox") and the doping of, for example, the doped well the varactor is formed in. MOS varactors may be an N+/n well type, a P+/p-well type, for example. The well doping concentration and Tox are both physical factors that may be determined by using the measured varactor capacitance observed. These characteristics make varactors very useful as process control monitors ("PCM's) in semiconductor fabrication. At a wafer acceptance test ("WAT") stage, measurements of a varactor formed as a test structure or PCM on the wafer can provide quality information about the Tox and the well doping characteristics of the wafer. Bad lots can quickly be identified and other wafers can be "binned" as better, or less better, lots based on the results of the WAT.

Further, because varactors offer a tunable capacitance, they are often used as circuit elements in radio frequency ("RF") and mixed signal circuit devices such as voltage controlled oscillators ("VCOs"), pulse controlled modulators ("PCMs"), delay lines, and the like. Of additional importance is the CV curve performance at various frequencies; for example, RFs are particularly important for semiconductor devices that might be used for forming circuits for cellphones or other wireless or radio components.

A continuing need thus exists for a MOS type varactor that is compatible with advanced semiconductor processes without the need for additional process steps, a varactor that is scalable across semiconductor process technology nodes, and which provides consistent performance compatible with modeling and circuit simulation across baseband, RF, MS and other frequencies, with an extended tuning ratio and which is useful as a PCM without the need for manual calibration steps after manufacture.

BRIEF DESCRIPTION OF THE FIGURES

For a more complete understanding of the present invention, and the advantages thereof, reference is now made to the following descriptions taken in conjunction with the accompanying drawings, in which.

Figure 1:
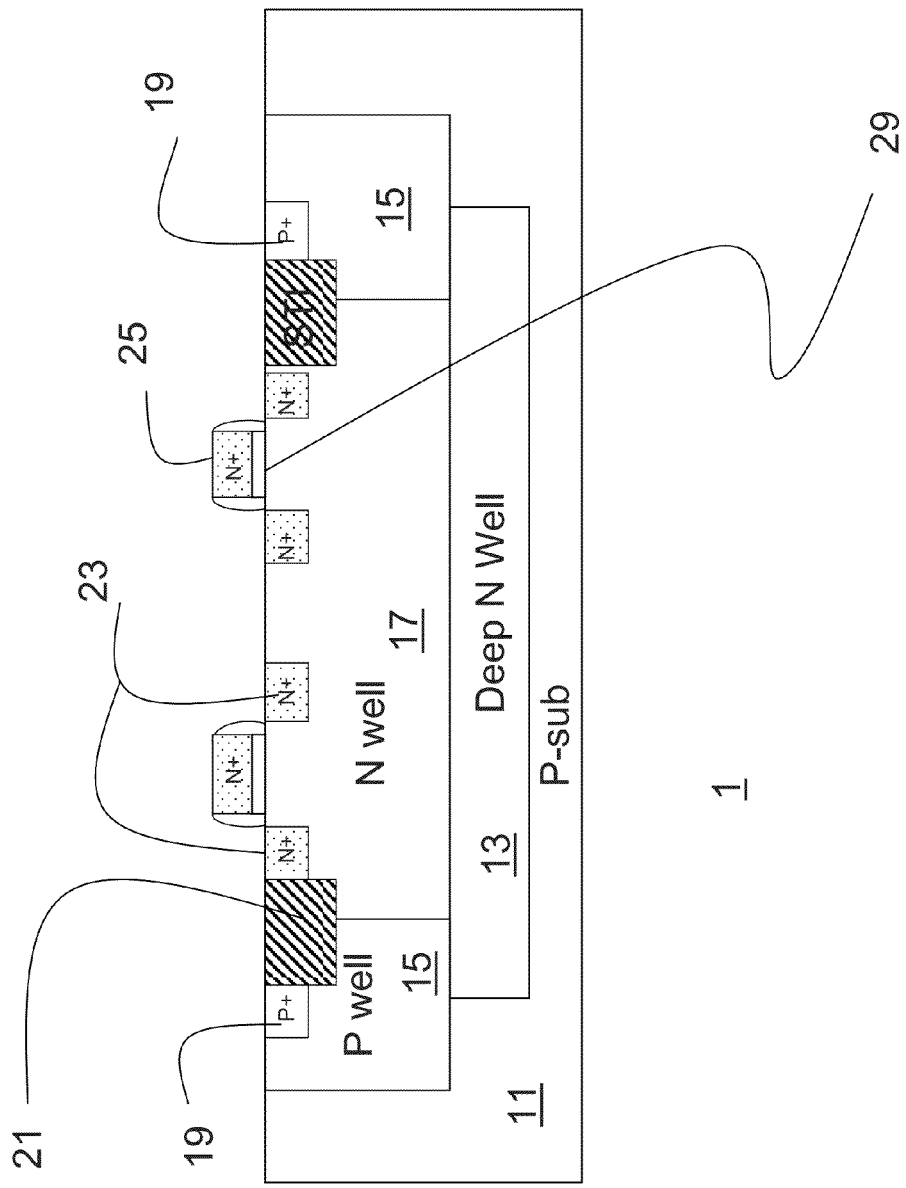
FIG. 1 depicts in a cross section a varactor structure.

The drawings, schematics and diagrams are illustrative and not intended to be limiting, but are examples of embodiments of the invention, are simplified for explanatory purposes, and are not drawn to scale.

DETAILED DESCRIPTION

The making and using of the presently preferred embodiments are discussed in detail below. It should be appreciated, however, that the present invention provides many applicable inventive concepts that can be embodied in a wide variety of specific contexts. The specific embodiments discussed are merely illustrative of specific ways to make and use the invention, and do not limit the scope of the invention.

Embodiments of the present application which are now described in detail provide novel methods and apparatus for a layout for MOS varactor cells that have a high-tuning ratio, and which exhibit a CV curve response that is consistent for modeling at baseband, mixed signal and RF frequencies, which provides expected CV performance without device calibration, which is scalable for use in semiconductor device testing, and which s useful in applications such as a wafer after test process control monitor for device characterization.

Conventional MOS varactors have extrinsic capacitances that occur due to metal to metal fringing capacitance formed in the layout structure. These extrinsic capacitances are in addition to the intrinsic capacitors that are created by, for example, forming an N+ to N well varactor structure. The additional extrinsic capacitance causes variances in the predicted or modeled responses between the modeled varactors and the actual varactors formed in semiconductor production. Because accurate device modeling is a crucial part of present day circuit design, these variances are undesirable. The capacitance to voltage or "CV" curve for the actual varactors produced in conventional MOS structures is inconsistent and exhibits frequency dependent variances. The frequency dependent variances may appear as a frequency offset or added phase noise in a circuit formed using the varactors. That is, the CV curves are inconsistent between the baseband frequency for, for example, the digital portion of a cell phone circuit, and the RF operation which would be observed for a varactor formed in the transceiver, or radio function, of the circuit which operates at radio frequencies. The CV variances cause a lower performance for the varactors in a reduced the tuning range (the range of capacitance values that are within the control voltage). Further, because calibration of these devices is needed at a variety of operating points, a larger than desired silicon area is needed to allow for calibration circuit and test pads.

In conventional MOS varactor structures, the "gate", "drain" and "source" connector terminals are formed using a metallization pattern over an active area, such as an area defined by the isolation oxide ("OD"). Capacitance extrinsic to the intrinsic capacitance of the varactor itself may form due to the physical proximity of these metal conductors which are parallel metal conductors spaced by insulating dielectric material. As the usefulness of a circuit element in modern circuit design is adversely impacted by any errors or unexpected differences in modeling and simulation, these variances from expected capacitor values for a gate voltage (variances in the CV curve) make using the varactors impractical. Calibration of the actual devices to adjust the models may be required after fabrication. Changes to the semiconductor process node (for example transitions to a more advanced process technology) will also affect the CV performance observed and require additional calibration or adjustment, as the CV curve depends on factors not easily predicted for a technology node. That is, the conventional MOS varactor performance is technology dependent, and not scalable.

In an embodiment, a cell layout for a MOS varactor is optimized by forming the source/drain and gate connections in a manner that eliminates or almost eliminates the extrinsic capacitances. The gate is formed in a first level metal ("metal 1") and polysilicon connection layers overlying an active area and a well in a semiconductor substrate. The source/drain connectors are formed in a second level metal ("metal 2") or a higher level metal overlying the active area, with the metal 2 and metal 1 conductors arranged so that the coupling capacitances between the source/drain and gate connections, that is the extrinsic capacitances, are reduced or eliminated. In this manner the extrinsic capacitances between gate and source/drain conductor connections to the varactor are reduced over the conventional MOS varactor layout, and the resulting varactor cell performance is greatly improved. The optimized cell layout is formed using existing metal layers and existing steps in semiconductor processing, and no additional process steps or added mask layers are needed to use the embodiments. No exotic or expensive materials are required to obtain the increased performance.

FIG. 1 depicts in a cross sectional view a varactor structure 1 that may be used with the embodiments. A semiconductors substrate 11 is provided; comprising silicon, gallium arsenide ("GaAS") or silicon germanium ("SiGe"), or other semiconductor materials. A wafer form of the substrate may be provided; alternatively a silicon on insulator ("SOI") layer may form substrate 11. In this illustrative and non-limiting example, a P type substrate is used. P type semiconductor material is formed by substituting appropriate dopant atoms, such as boron ("B"), in the crystal lattice.

A well is formed for containing the varactor. Deep N well 13 is formed. In the embodiment of FIG. 1, isolation for the N well 17 which contains semiconductor material doped by implantation to a N type conductivity, using dopants such as phosphorous ("P") and the like, is isolated electrically by shallow trench isolation ("STI") regions 21. The STI regions are formed as a trench filled with insulator material. Other forms of isolation such as LOCOS could be used. In addition, in this example embodiment, P well regions 15 provide additional isolation and P+ ohmic contacts 19 provide a body or bulk contact to the substrate 11.

MOS varactor elements are formed in N well 17. As is known to those skilled in the art, gate structures 25 are formed over a gate dielectric 29. In the illustrated embodiment of FIG. 1, two gate structure portions 25 are shown, although one or more may be provided in the well 17. The varactor is not a transistor so some structures often used in transistor fabrication are not shown, such as lightly doped source and drain diffusions, channel doping, and silicide are not shown. However source/drain contacts 23 are formed adjacent either side of the gates 25. The gate dielectric may be a thermally grown or otherwise formed gate dielectric. Oxide, nitride, oxynitride or the like may be used for the gate dielectric. Low K and high K gate dielectric material may be used, more typically thermally grown oxides such as $SiO_2$ may be used Gates 25 include sidewall spacers as are typically formed for gate structures. These may be used for alignment of the N+ source and drain regions 23 which are implanted regions doped to an N+ conductivity within the N well 17. While the N+ regions 23 may be formed self aligned to the gates 25, alternatively, non self aligned processes may also be used.

Figure 2:
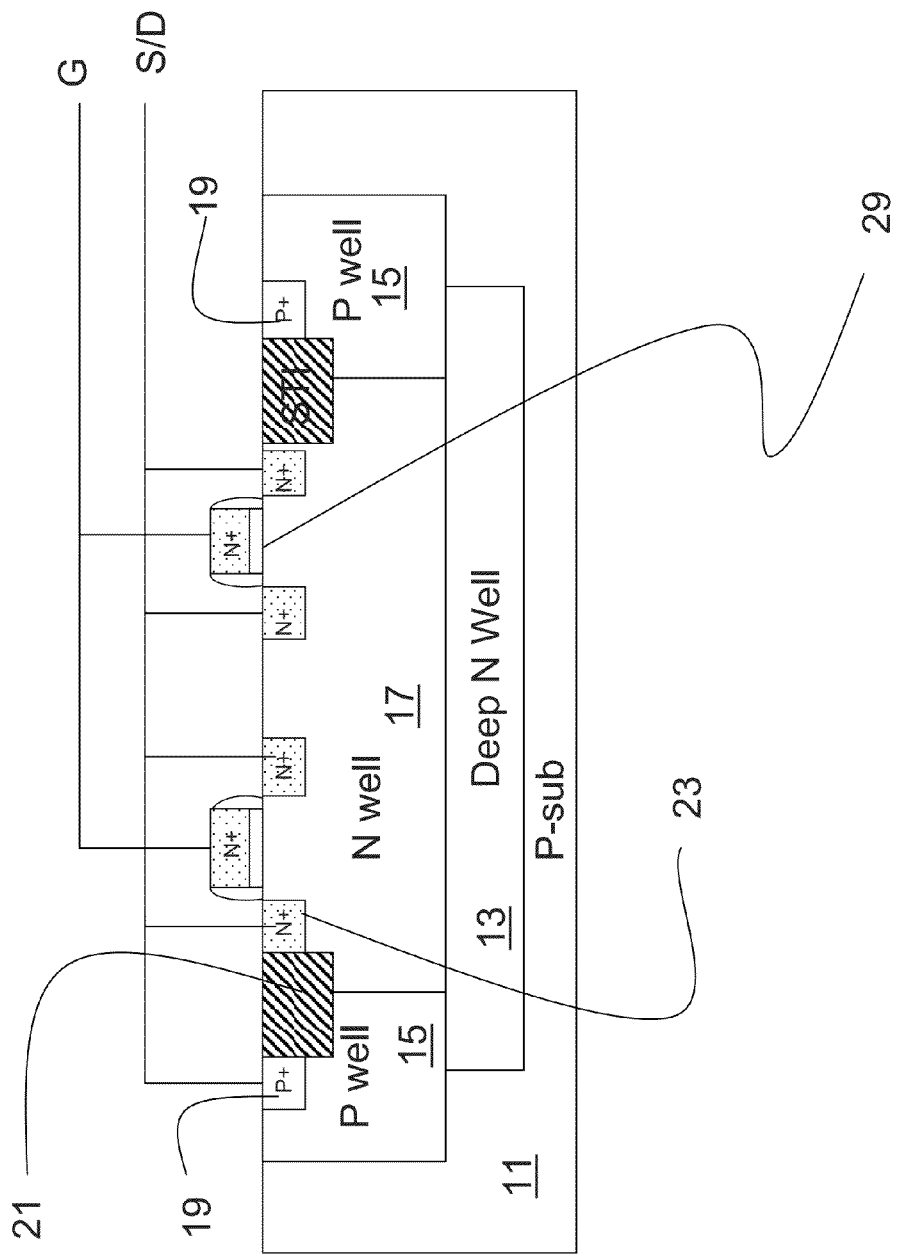
FIG. 2 depicts in a cross section the varactor structure of FIG. 1 with additional connections.

FIG. 2 illustrates the structure 1 of FIG. 1 and in addition depicts the connections for the gate and source/drain terminals. Gate conductors "G" are coupled together and to the gates 25 which are formed of polysilicon, for example, and this is shown doped to an N+ conductivity. Alternatively, metal gates may be used. In a "gate last" process, the gate material may be formed as a sacrificial gate, and after the other process steps are completed, the gate material may be removed and a metal conductor formed to replace the sacrificial gate. However, in an embodiment described here, these additional process steps are not needed and a polysilicon gate is used.

The source/drain connections "S/D" are shown and form the other terminals of the varactor. In a test structure, the source drain terminals may be connected together and also conveniently to a bulk contact, P+ region 19, and to a ground terminal. Then, a control voltage may be applied to the gate so that a gate to source voltage Vgs is expressed across the gate and source terminals. The capacitance obtained for a given gate voltage may be plotted to measure the CV curve for the varactor. When the varactor is used instead as an RF circuit element, the source and drain terminals may be coupled differently to provide a capacitor, the gate may receive a control voltage to tune the capacitor and thus adjust the circuitry. The three terminals then form a voltage dependent capacitor.

Figure 3:
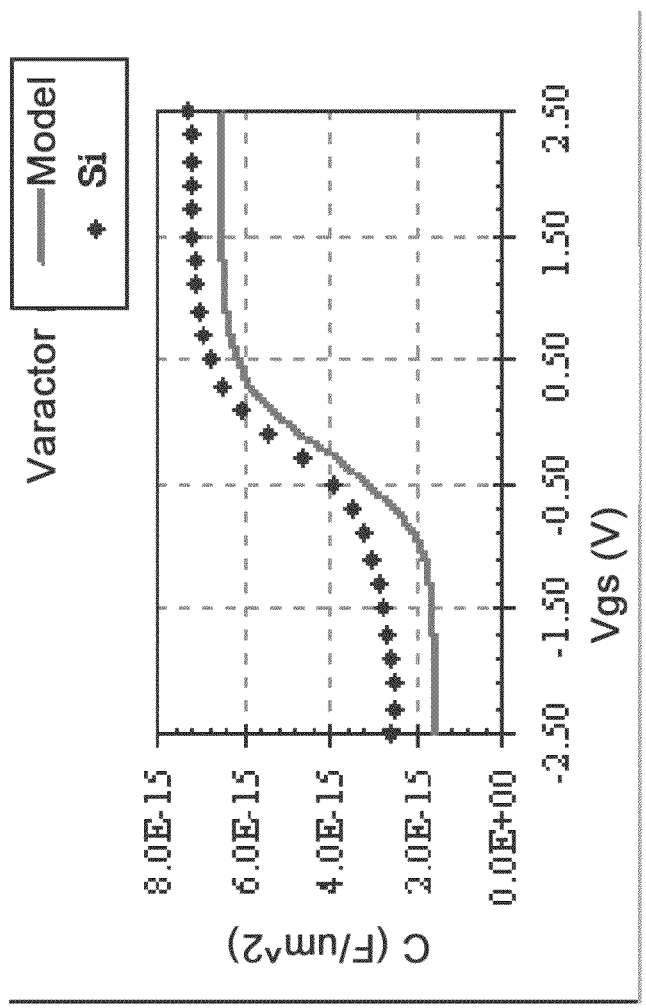
FIG. 3 depicts a CV curve for a varactor.

FIG. 3 depicts a pair of CV curves obtained for a varactor such as shown in FIG. 2. In FIG. 3, a first curve (the model or predicted CV curve) is shown and measured points for a fabricated device are plotted as well. As shown in FIG. 3, the voltage Vgs is applied from a negative voltage, respective to ground, to a positive voltage, and the capacitance obtained is measured. The minimum capacitance Cmin in FIG. 3 is around $2 \times 10^{-15}$ Farads per micron squared, and the maximum (at the right side of the plot) is around $6 \times 10^{-15}$ Farads per micron squared A figure of merit for varactors, the "tuning ratio" indicates the range of capacitances available using the control voltage. In this illustrative example, the tuning ratio is about 3, which is Cmax/Cmin. Ideally, a varactor will have a large tuning ratio as this allows for a larger range of capacitance in a circuit application. The extrinsic capacitance of conventional layout varactor cells acts as a physical limit on the tuning ratio, as it limits the minimum capacitance Cmin— even if the adjusted capacitance is lowered, the extrinsic capacitance adds to the minimum and restricts the tuning ratio for that device.

Figure 4:
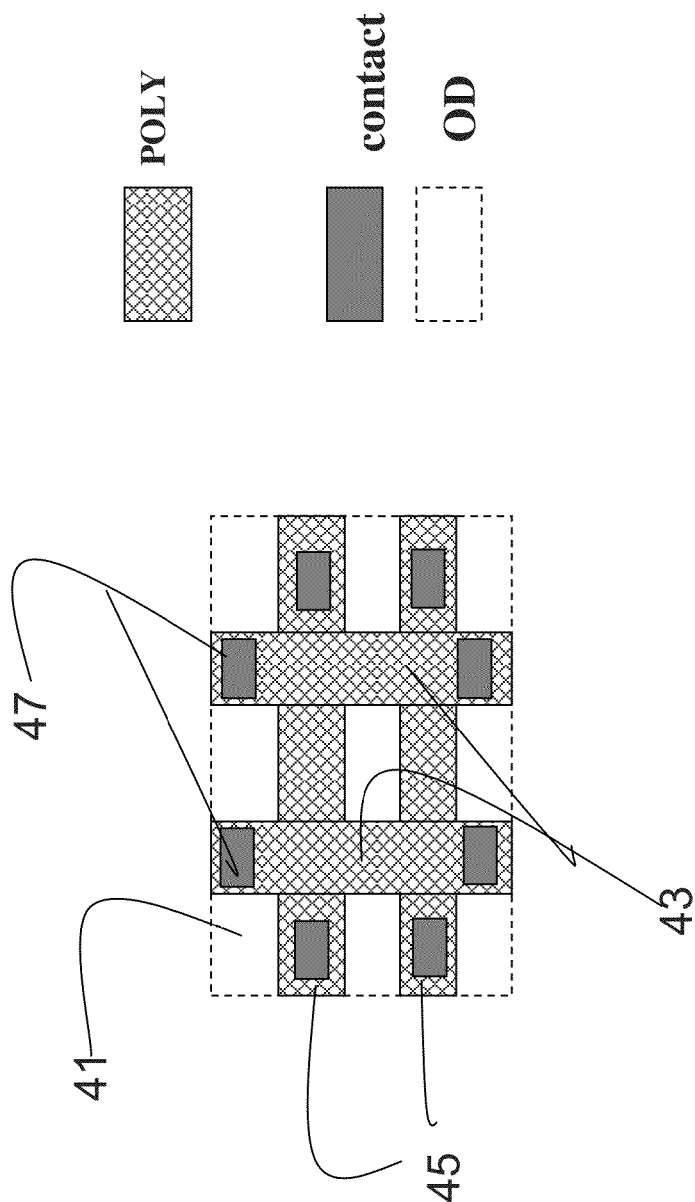
FIG. 4 depicts in a plan view a portion of an embodiment varactor cell.

FIG. 4 depicts in a plan view a first portion of a layout of an embodiment varactor that has an optimized layout to improve the performance. First the gate portion of a layout will be illustrated in various layers so that the combined structure can be clearly understood. Next the source/drain portion will be shown, and then the combined cell layout will be shown. Hidden layers will be shown in outline when overlying layers would normally obscure these from the plan view.

In FIG. 4, an active area defined as OD 41 is shown. Two gate strips 43 are formed in polysilicon. In the orientation shown, these strips 43 are shown running vertically or up and down. Of course this is an arbitrary orientation shown for ease of explanation. As an example for an N+/N well varactor, the polysilicon may be doped to an N+ conductivity type. Further, four contacts 47 are formed on the gates 43. These will be used to couple a metal 1 gate connector (not yet shown) to the polysilicon gate structures as described in detail below. Two horizontally oriented polysilicon straps 45 are shown running left to right in FIG. 4. These are formed to couple the two gate strips to form a cross coupled cell. Contacts are also shown formed on these polysilicon strips at the ends and these will also couple to a metal 1 gate connector as described below.

Figure 5:
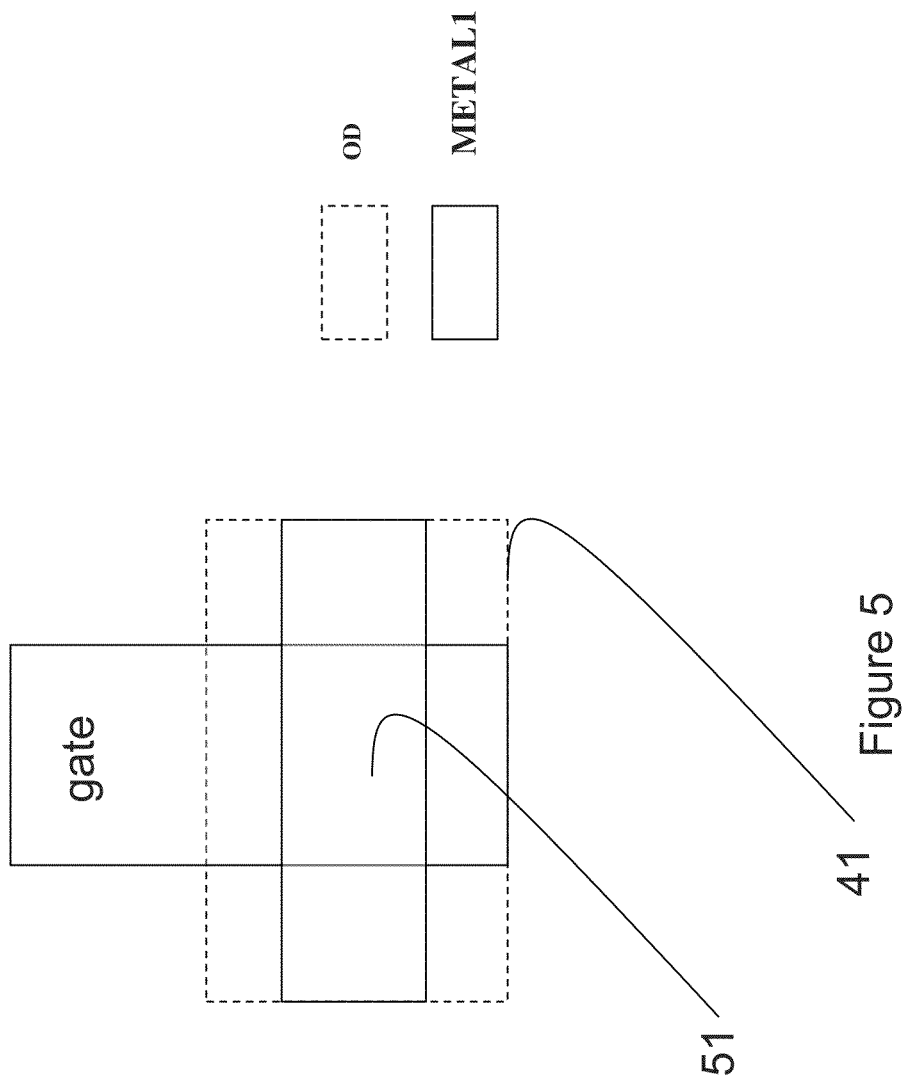
FIG. 5 depicts in a plan view another portion of an embodiment varactor cell.

In FIG. 5, a plan view of the metal 1 pattern for the gate portion of an embodiment of the varactor cell layout is depicted. OD 41 defines the active area which is, as in FIGS. 1 and 2, an N well in the substrate. An interlevel dielectric layer, not visible here, is formed over the polysilicon layer, and a metal 1 layer 51 is formed in a metal 1 dielectric material. If aluminum conductors are used, sputtering and other aluminum metal processes may be used. If copper single or double damascene processing is used, as is more prevalent, then a trench may be formed in the dielectric layer, and seed material deposited, and copper may be formed by electroless or electrochemical deposition, to overfill the trench, and the excess metal is polished back to the upper surface of the trench using chemical mechanical polishing ("CMP"). Copper, copper alloys, may be used, barrier layers may be used to line the trench to prevent copper diffusion, and cover layers of nickel, palladium, gold, and the like may be used as is known in the art. In FIG. 5, the metal 1 layer is formed as a "t"-shape, overlying the vertical gate strips shown in FIG. 4, and the contacts to the polysilicon layer, and also, overlying the horizontal cross coupling straps of FIG. 4, and the polysilicon contacts, so that the metal 1 gate conductor couples together all of the polysilicon strips 45 and 43 using the polysilicon contacts 47 to form a low resistance metal 1 gate portion.

Figure 6:
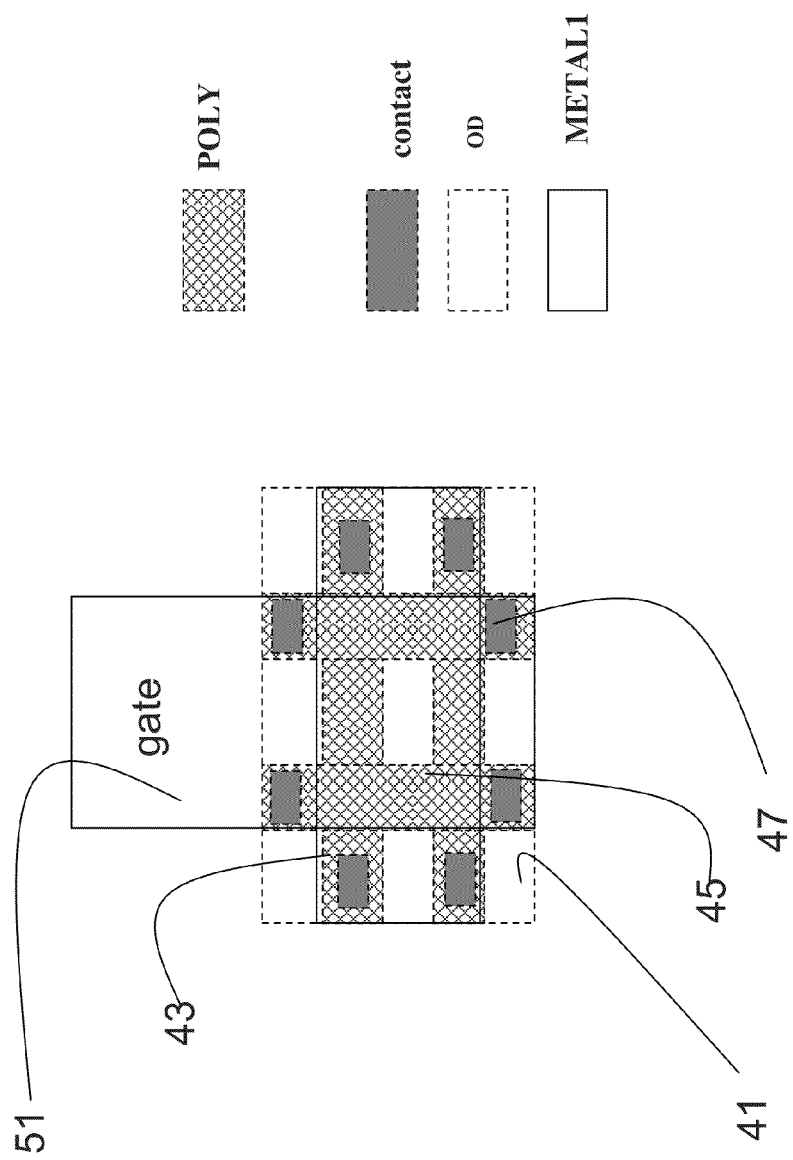
FIG. 6 depicts in a plan view another portion of an embodiment varactor cell.

FIG. 6 illustrates in a plan view the combined gate structures including metal 1, the contacts to polysilicon, and the polysilicon over the active area for the varactor cell. Here the metal 1 layer 51 is shown on top with the dashed lines for the contacts 47 and the polysilicon 43 and 45 illustrating the positions of the underlying polysilicon and the contacts. Thus the gate portion of the varactor cell is complete and does not extend to any other metal layers, for example metal 2 is not used for any of the gate portion.

Figure 7:
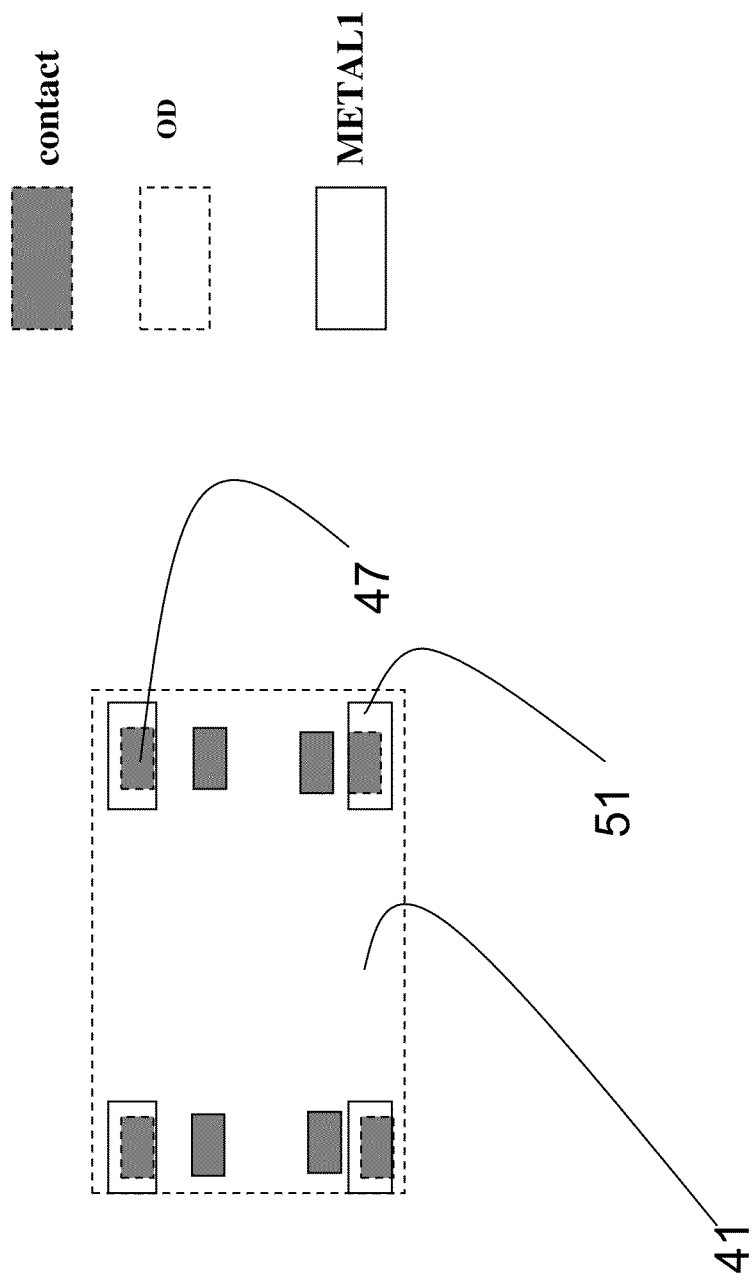
FIG. 7 depicts in a plan view another portion of an embodiment varactor cell.

FIG. 7 illustrates in a plan view a first part of the source/drain layout for the varactor cell of this illustrative embodiment. In FIG. 7 only the OD 41, contacts 47, and metal 1 51 are shown. Note that the metal 1 portions shown in FIG. 7 are used only as part of a vertical source/drain contact path to the substrate, and the metal 1 layer illustrated here does not include all of the metal 1 in the varactor cell. Contacts 47 are shown underlying the metal 1 portions to form another part of the vertical source/drain contact paths.

Figure 8:
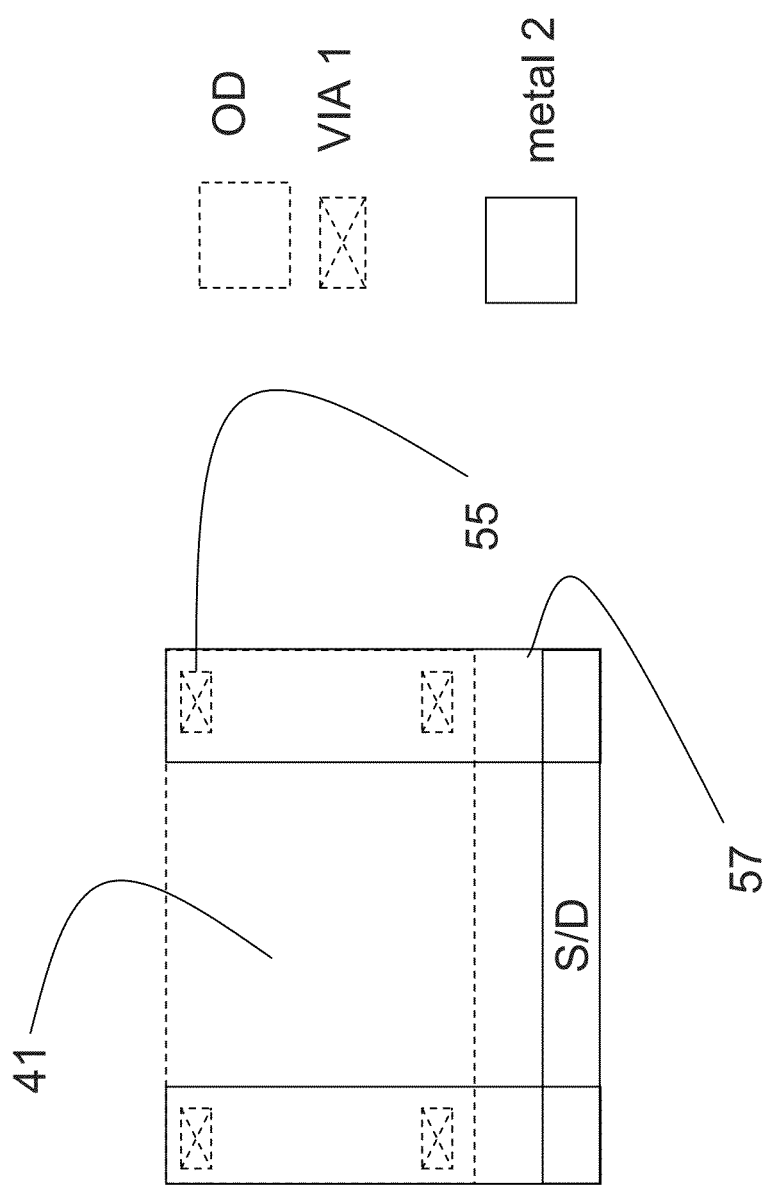
FIG. 8 depicts in a plan view another portion of an embodiment varactor cell.

FIG. 8 illustrates in a plan view the active area OD 41 and only the vias 55 that are VIA 1 layer vias, extending from the metal 1 layer to the metal 2 layer, and the metal 2 pattern for the source drain connector portion of the varactor embodiment. As for metal 1, the metal 2 layer is isolated from the underlying portions by an interlayer dielectric, not shown, and the metal is formed in an insulating dielectric material metal 2 layer. Aluminum conductors or more prevalently now, copper conductors may be formed. Sputtering of the aluminum or single or dual damascene and CMP copper processes may be used to form the S/D metal 2 pattern 57. The vias 55 are conductive vertical paths and may be formed from conductive plugs, or in damascene processes may be formed as via first, or trench first, processed metal to metal vias. Metal 2 layers 57 are shown forming a source/drain connector overlying the contacts 55 and coupling the source and drain regions together. In alternate cell layouts for different applications, the source and drain connections could be formed as electrical separated terminals.

Figure 9:
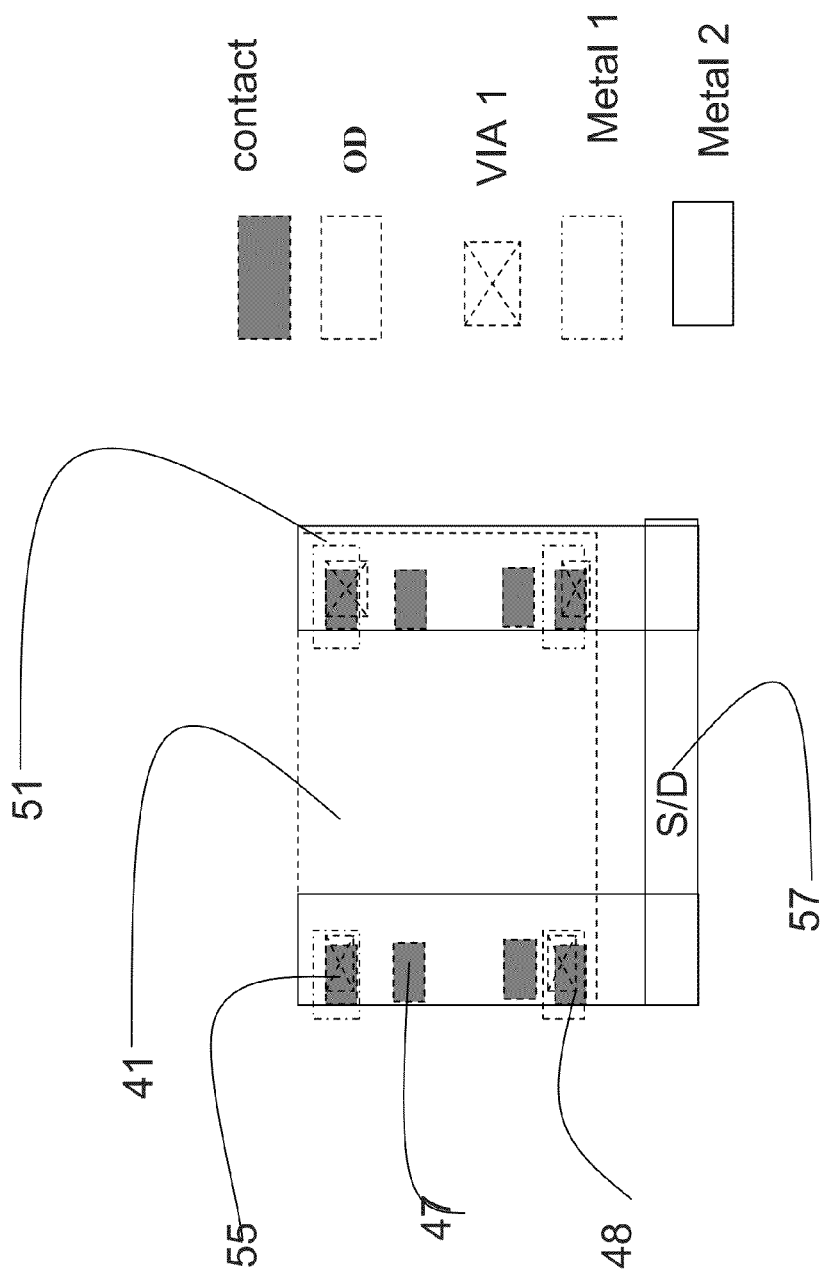
FIG. 9 depicts in a plan view another portion of an embodiment varactor cell.

FIG. 9 illustrates in a plan view the complete source/drain portion of the layout of an embodiment varactor cell. In FIG. 9, metal 2 layer 57 forms the source/drain connections and overlies the structure. Metal 1 portions 51 form part of a vertical connection from the metal 2 to the substrate contacts for the source and drain. VIA 1 vias 55 couple the metal 2 and metal 1 portions together over the contacts 47. The contacts complete the vertical connections to the substrate from metal 2 to VIA 1 metal 1 to contact to the source/drain regions 23 in the well portion of the substrate. Although the source and drain connections are coupled together in this embodiment, in other arrangements for the varactor, the connections for the source and drain may be formed separately to provide two plates for the capacitor and a third terminal (the gate) is used for the control voltage.

Figure 10:
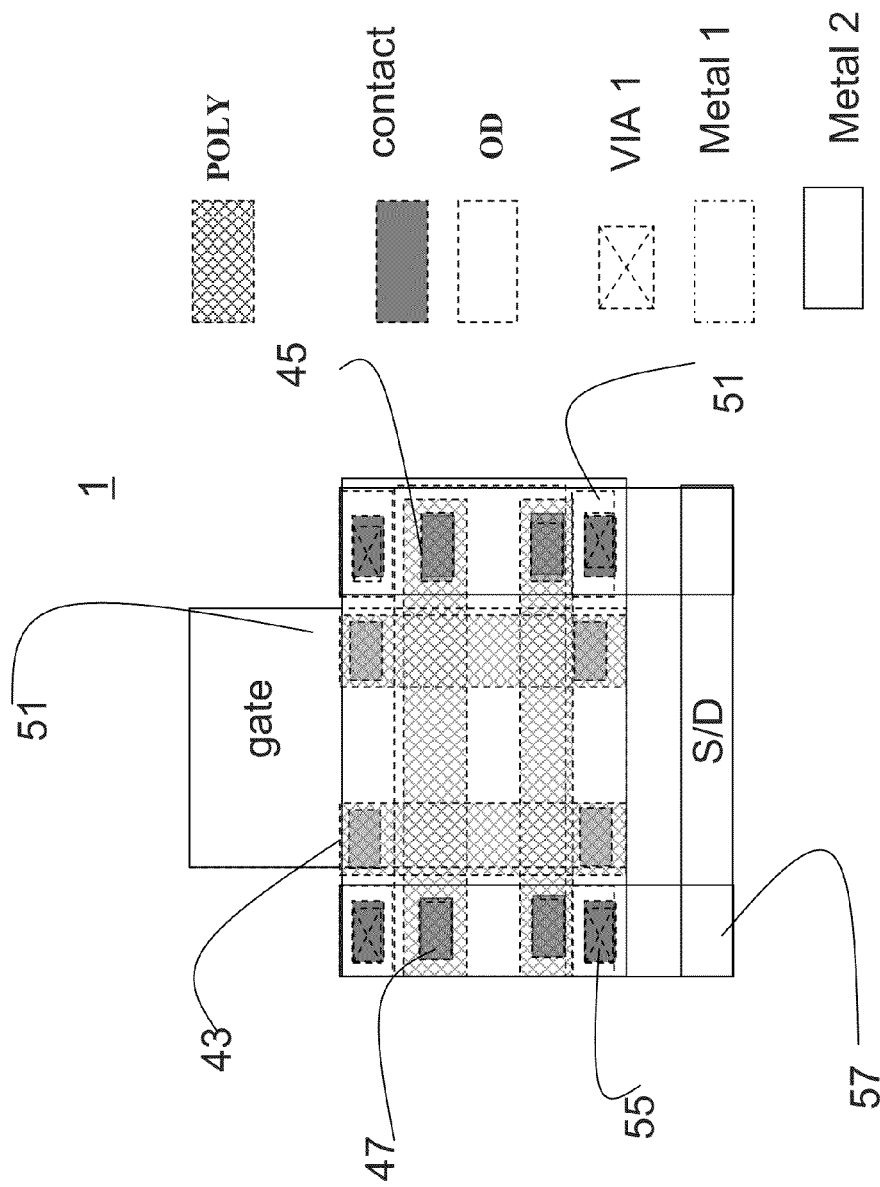
FIG. 10 depicts in a plan view another portion of an embodiment varactor cell.

FIG. 10 illustrates in a plan view the completed varactor cell layout for the embodiment varactor cell. Now the source/drain layout portions of FIG. 9 are combined with the gate portions of FIG. 6 and the cell is completed. In FIG. 10, the metal 2 layer 57 for the source and drain is the top layer in the plan view, so the underlying layers are shown as dashed areas. The gate portion 51 is in metal 1 and forms a connector at the top of the cell, but underlies the metal 2 layer in part and is dashed where it would be obstructed from view. VIA 1 vias 55 couple the metal 2 layer vertically down towards the substrate and to portions of the metal 1 layer, and then contacts 47 couple the source drain to the substrate. Polysilicon gates 43 and the straps 45 are formed underneath the metal 1 level, which is gate 51 and the polysilicon portions are coupled to metal 1 by additional contacts 47 as shown. Thus in the embodiment varactor cell, the source/drain connectors are primarily formed at the metal 2 layer. The gate is formed on the metal 1 layer and no part of the gate portion is at metal 2. The fringing capacitance that would otherwise form between the source/drain and gate connections in the layout is eliminated, because the metal 2 and metal 1 layers are not formed as parallel fingers at the same level of the structure. Further, the source/drain metal 2 portion is formed primarily at the outer sides of the active area while the gate portion in metal 1 is formed in the central portion, reducing the overlap vertically as well. The extrinsic capacitance of the embodiment varactor is greatly reduced or eliminated when compared to the prior conventional layout varactor cells.

Figure 11:
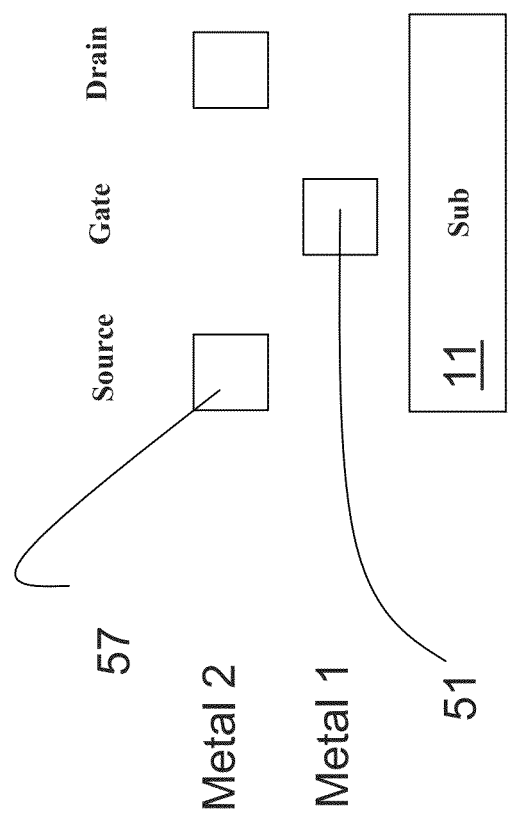
FIG. 11 depicts in a cross sectional view a portion of an embodiment varactor cell.

FIG. 11 depicts in a cross sectional view the relationships of the metal 1 and metal 2 layers in the varactor cell embodiment of FIG. 10. The source and drain regions are formed primarily of metal 2, layer 57, which lies over the outer sides of active area. The gate portions are formed in metal 1, layer 51, which lies at a level beneath metal 2. Although not shown in the figure for simplicity, dielectric material separates the metal 1 and metal 2 layers vertically and dielectric material surrounds the metal conductors; so that fringing capacitance between metal 1 and metal 2 is reduced or eliminated.

Figure 12:
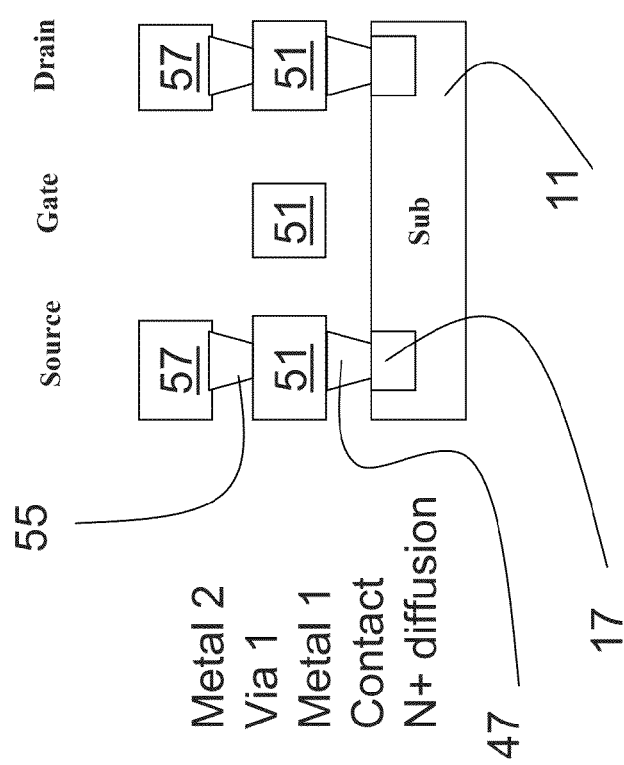
FIG. 12 depicts in a cross sectional view a portion of an embodiment varactor cell.

FIG. 12 depicts in cross sectional view the vertical connections between the source and drain metal 2 layer 57, and the N+ source/drain regions in the N well, for example 23 in FIG. 1. The metal 2 layer overlies a VIA 1 via 55 between metal 2 and metal 1, then a metal 1 portion, then a contact portion 47, then makes contact to an N+ region 23 in the well 17 formed in the substrate 11.

Figure 13:
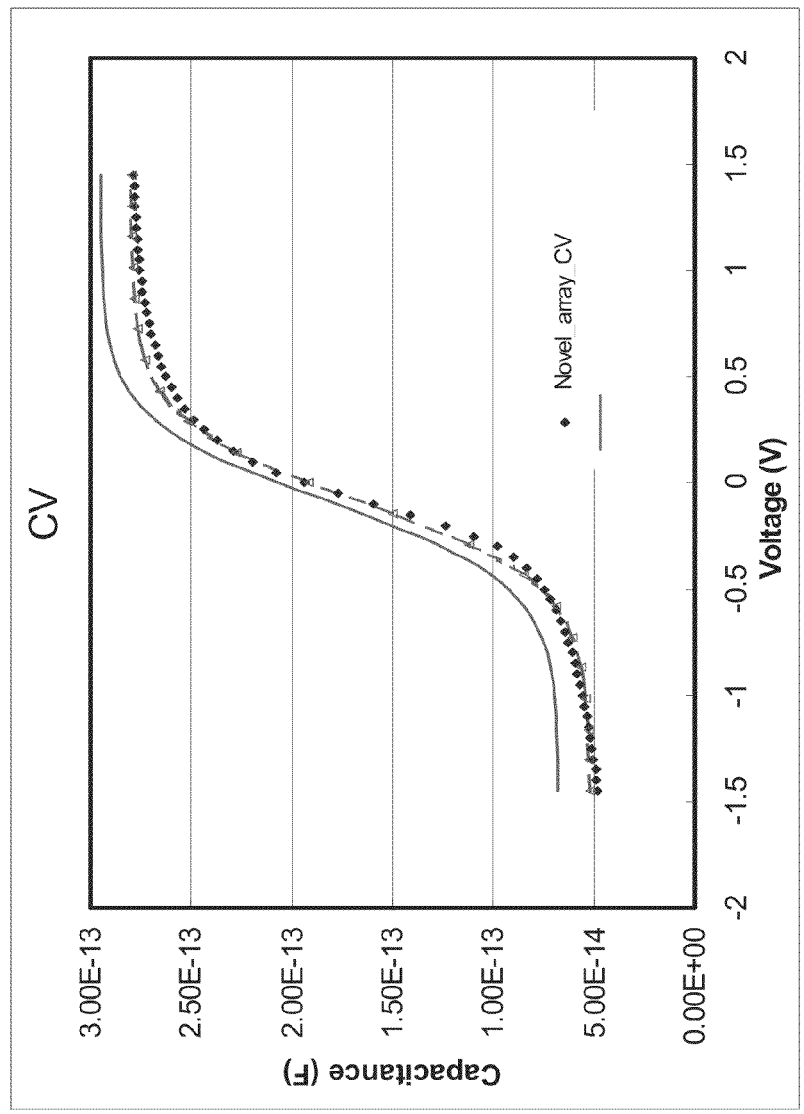
FIG. 13 depicts a CV characteristic curve plot for an embodiment varactor cell.

FIG. 13 depicts the CV characteristic obtained for a varactor implemented in a 65 nanometer semiconductor process using the embodiment cell layout. The straight line curves are device model performance, while the plotted points are measured data of fabricated devices. In sharp contrast to the conventional varactor CV curves of FIG. 3, the exemplary embodiment CV curve close matches the modeled performance. There is very little variance across the tuning range. Also, and surprisingly, the tuning ratio for the exemplary embodiment (Cmax/Cmin) is greatly extended. The minimum capacitance observed as $5 \times 10^{-14}$ Farads, while the maximum observed is about $3 \times 10^{-13}$ Farads, which gives a Cmax/Cmin tuning ratio of about 6; much greater than the tuning ratio for the prior conventional varactor cell. Importantly, the increased performance is obtained without the need for using low k dielectric material or metal gate technologies, keeping costs low and processes simple for the embodiments.

The varactor embodiments may be used in a variety of configurations. A single ended varactor as described above with source and drain coupled together and to ground may be formed as an N+/N well varactor, or as a P+/P well varactor. Differential ended varactors may be formed also as N+/N well or P+/P well varactors. The varactor cell is easily replicated in a grid or pattern to form an array of cells that may be coupled as a larger varactor or as a plurality of independently controlled varactor cells. The varactor cells may be used in arrays to form larger varactors, or varactor banks, and may be used with linear capacitors to form a capacitor bank. As is known to those skilled in the art, a linear capacitor may be formed using a MOS transistor structure using the gate terminal as one plate, and the source/drain terminals of the other capacitor plate. By pairing a plurality of these linear capacitors with varactors a highly tunable capacitance can be created.

Figure 14:
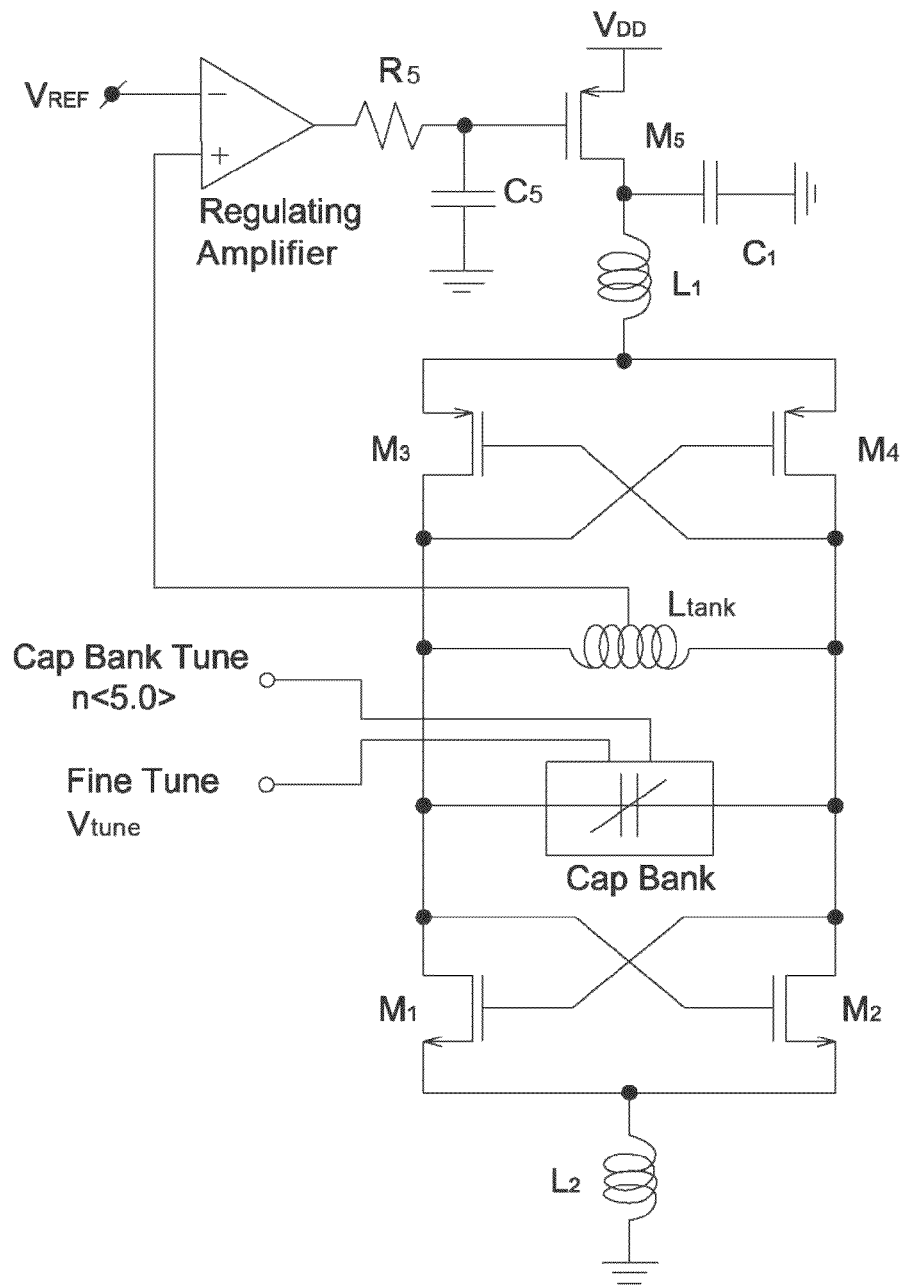
FIG. 14 depicts in a circuit diagram an oscillator for use with an embodiment varactor cell.

In FIG. 14 a circuit diagram for a voltage controlled oscillator where the embodiment varactor cell may be used is shown. A regulating amplifier receives a voltage reference Vref and compares a feedback voltage taken from the inductor labeled Ltank. An RC circuit of resistor R5 and capacitor C5 then couple the output of the regulating amplifier to the gate of the PMOS transistor M5, which supplies inductor L1 and capacitor C1. The oscillator circuit include a differential amplifier formed from pull up transistors M3 and M4, which in this embodiment circuit are PMOS transistors, and pull down transistors M1 and M2 which are NMOS transistors, coupled to an inductor L2 and then to ground. A variable capacitor "Cap Bank" is coupled across the differential amplifier and receives two inputs, an array of capacitor selector inputs labeled "Cap Bank Tune n<5:0>"; and a fine tune input labeled "Vtune".

In operation, the frequency of the oscillator is determined in part by the capacitance value of the capacitor "Cap. Bank" which is settable by the user using the input signals. The capacitor forms an LC time constant with the inductors in the circuit, so changing this capacitance enables a tuning of the frequency of the oscillator.

Figure 15:
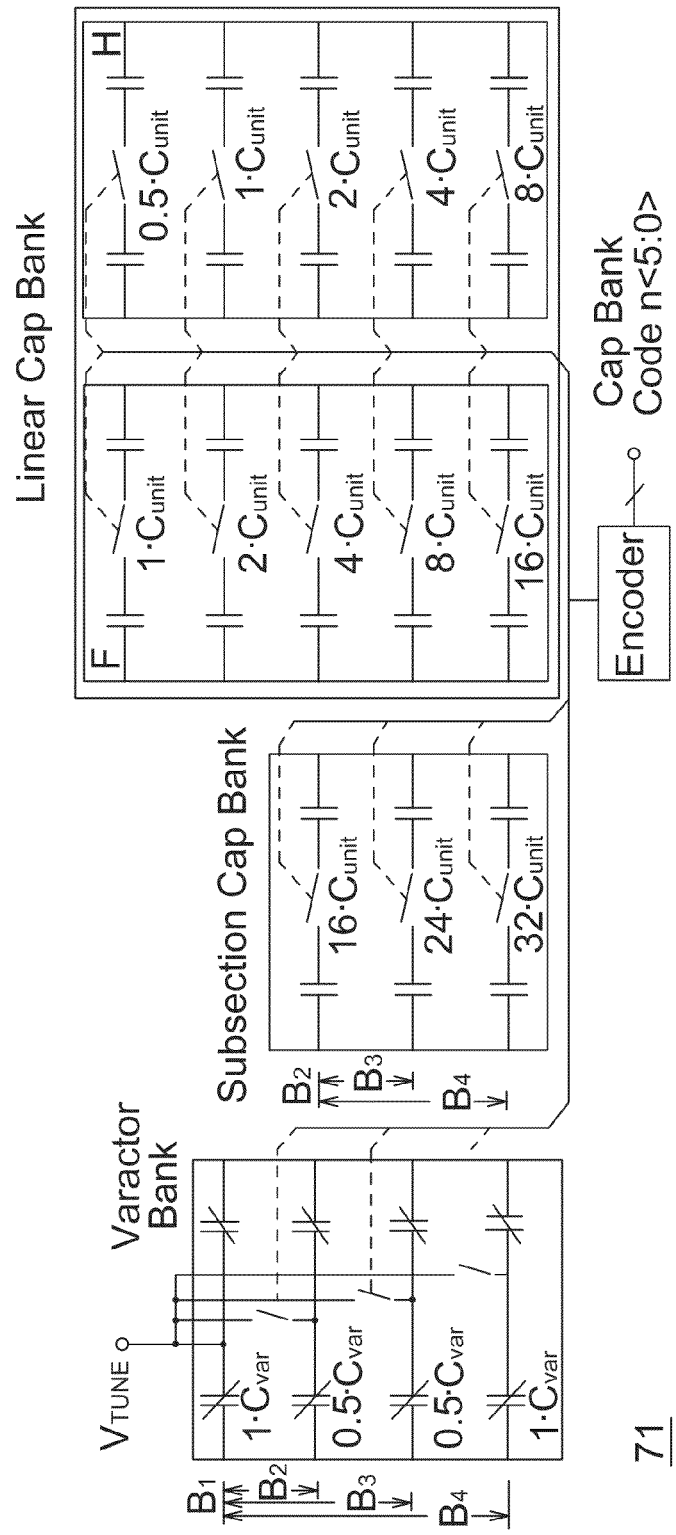
FIG. 15 depicts in a circuit diagram a varactor and capacitor bank for the circuit of FIG. 14.

FIG. 15 depicts in detail the use of the varactors with linear capacitors to form a variable capacitor 71. In FIG. 15, the Vtune input is coupled to a plurality of varactors using switches to form a fine tuning portion of a switched capacitor bank. The remaining capacitance is formed by the switched capacitors in the "Subsection Cap Bank" and the "Linear Cap Bank" which is selectively added to the circuit in response to the encoders input.

Figure 16:
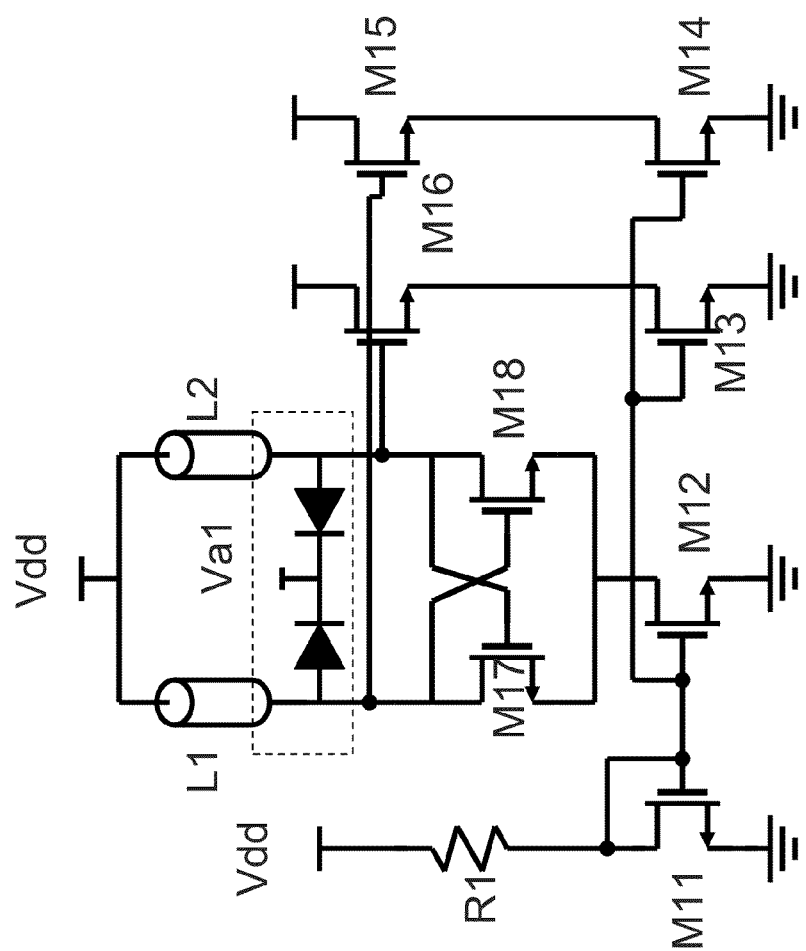
FIG. 16 depicts in a circuit diagram for a voltage oscillator circuit for use with an embodiment varactor cell.

FIG. 16 illustrates in a circuit diagram a voltage controlled oscillator circuit that may be used with the embodiment varactor cell of FIG. 10. Varactor Val is formed of two varactor cells coupled to form opposing varactors between the sides of a differential transistor amplifier circuit formed of transistors M17 and M18. The remaining transistors are configured to form an oscillator, resistor R1 and transistors M11, M12, M13, and M14 form bias circuits, and transistors M16 and M15 provide output nodes for the circuit. The frequency of the oscillator is controlled in part by the capacitors formed by the varactors in Va1 and the inductors L1 and L2. By varying the value of the capacitors using the varactor control voltage, the oscillator may be tuned.

In characterizing the performance of the circuit of FIG. 16 using varactors, important metrics are the tuning range of the varactors, the gain "K" of the VCO circuit, which corresponds to the tuning range, and the phase noise of the varactor, which also corresponds to the frequency performance of the circuit. With respect to the phase noise, the variance of the CV curve may cause a frequency offset in the VCO performance. By using the improved varactor cell layout of the embodiments, the phase noise is reduced, the tuning range is extended, and the performance of the VCO with the varactor of the embodiments is also improved.

Figure 17:
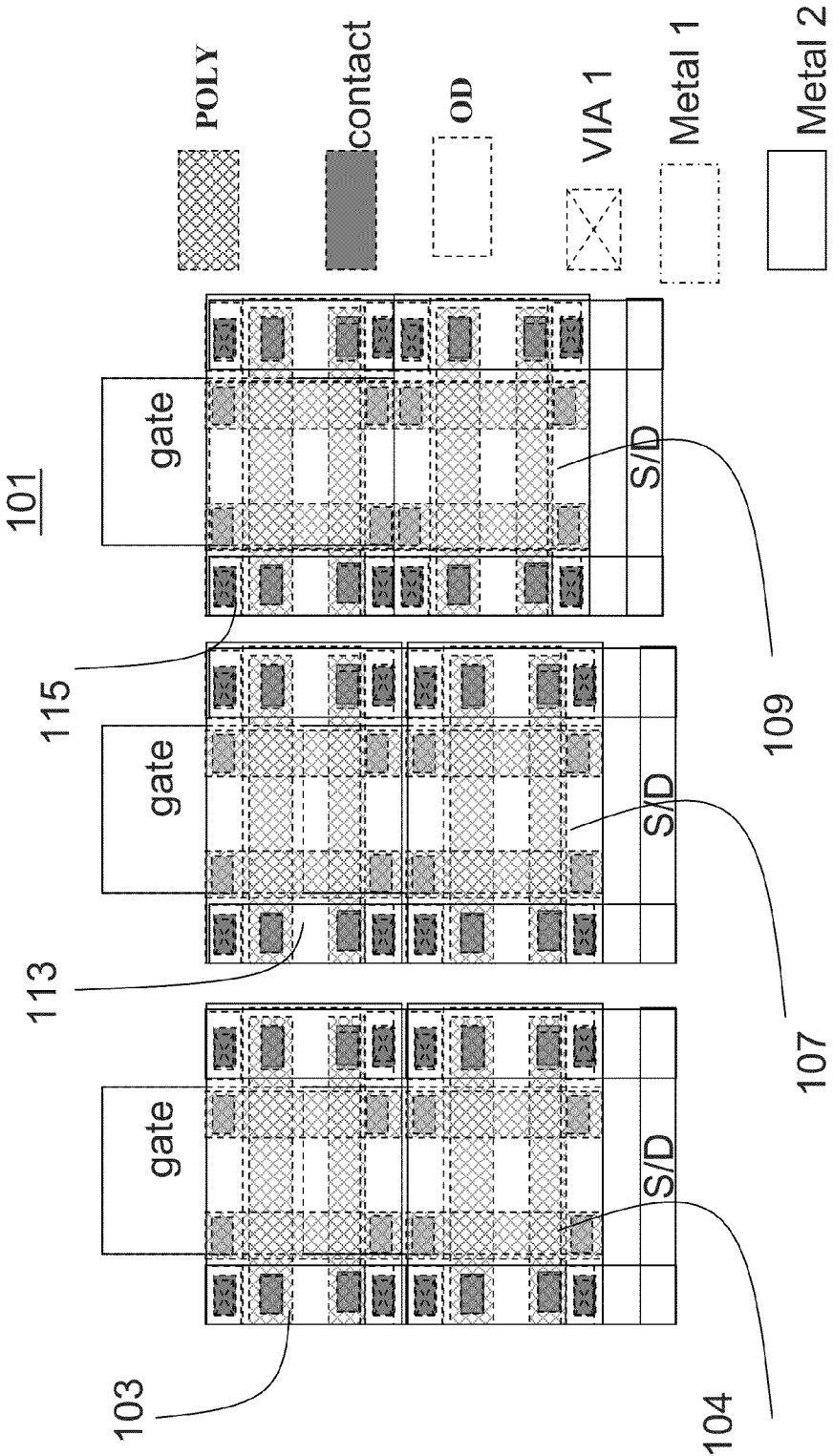
FIG. 17 depicts an embodiment array of varactor cells in a plan view.

FIG. 17 depicts in a plan view a varactor array layout formed of the varactor cells of an embodiment. In FIG. 17, array 101 is formed of the varactor cells of FIG. 10 arranged in an array. The cells 103 and 104 have a common gate terminal and source/drain terminals extending across the two cells. Cells 113 and 107 likewise share a common gate terminal and source and drain terminals. Cells 115 and 109 likewise share a common gate terminal and source and drain terminals. The cells may be arranged in many different sized arrays and may have common or independent control voltages and common or independent source and drain terminals for use in a variety of circuit applications.

Figure 18:
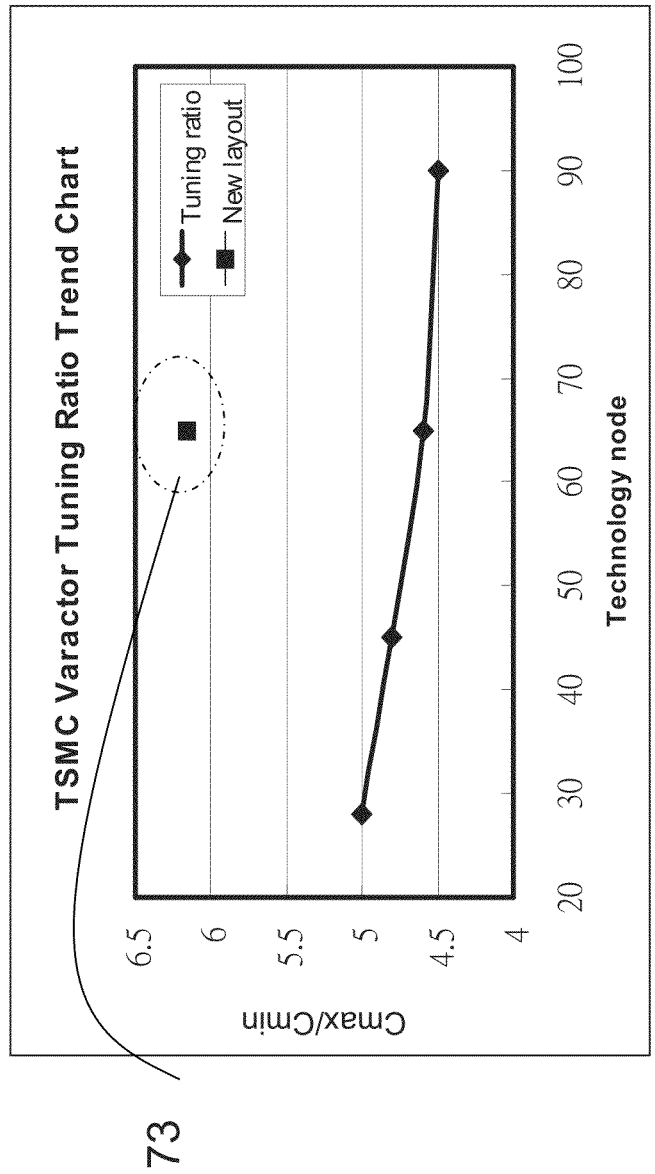
FIG. 18 depicts in a chart the tuning ratio for an embodiment varactor cell compared to technology nodes and tuning ratios for conventional varactor cells.

FIG. 18 depicts a comparison showing the tuning ratio for conventional varactor cells in process nodes varying from a minimum feature size of 28 nanometers to one of 90 nanometers, and at point 73, the results obtained for an embodiment varactor cell of this application fabricated in a 65 nanometer semiconductor process. The tuning ratios for the conventional devices varied from 5 to about 4.5. In a surprisingly large improvement the varactor made using the exemplary varactor cell layout exhibits a 6.2 tuning ratio at the 65 nanometer node. Thus by utilizing the cell layouts of the exemplary cell embodiments, without any other modifications, the varactor performance is increased markedly over the conventional varactor cells. No additional complex manufacturing steps such as the use of high K gate dielectric, metal gates, and the like were needed to obtain this result which is scalable and process node independent.

In an embodiment, an apparatus comprises a semiconductor substrate; an active area defined in a portion of the semiconductor substrate; a doped well region in the active area extending into the semiconductor substrate; at least two gate structures disposed in parallel over the doped well region, the gate structures comprising conductors lying over gate dielectric material; source and drain regions disposed in the well region formed on opposing sides of the gate structures; a gate connector formed in a first metal layer overlying the at least two gate structures and electrically coupling the at least two gate structures; source and drain connectors formed in a second metal layer and overlying the source and drain regions the well region and electrically coupled to the source and drain regions; and interlevel dielectric material electrically separating the source and drain connectors in the second metal layer from the gate connector formed in the first metal layer. In another embodiment, the above described apparatus further includes the gate connector wherein no portion of the gate connector is formed in the second metal layer.

In another embodiment, an apparatus comprises circuitry formed on a semiconductor substrate having a frequency dependent function, the circuitry including inductors and at least one tunable varactor cell, the at least one varactor cell further comprising an active area defined in a portion of the semiconductor substrate; a doped well region in the active area extending into the semiconductor substrate; at least two gate structures disposed in parallel over the doped well region, the gate structures comprising conductors lying over gate dielectric material; source and drain regions disposed in the well region formed on opposing sides of the gate structures; a gate connector formed in a first metal layer overlying the at least two gate structures and electrically coupling the at least two gate structures; source and drain connectors formed in a second metal layer and overlying the source and drain regions the well region and electrically coupled to the source and drain regions; and interlevel dielectric material electrically separating the source and drain connectors in the second metal layer from the gate connectors formed in the first metal layer.

In another embodiment a method comprises disposing at least two varactor gate conductors arranged in parallel over an active area defined in a semiconductor substrate, the two parallel gate conductors overlying gate dielectric material; disposing source and drain regions in the active area and on opposite sides of the gate conductors; forming a first metal layer gate connector over the at least two varactor gate conductors; electrically coupling the first metal layer gate connector to the varactor gate conductors using vertical contacts through an insulator material; forming a second metal layer source/drain connector over the active area spaced from the gate connector; and electrically coupling the source and drain regions to the second metal layer source/drain connector by forming vertical connections comprising a first level via through an interlevel dielectric to a first metal layer portion and a contact to the source drain regions in the active area.

Although exemplary embodiments and their advantages have been described in detail, it should be understood that various changes, substitutions and alterations can be made herein without departing from the spirit and scope of the invention as defined by the appended claims. For example, it will be readily understood by those skilled in the art that the methods may be varied while remaining within the scope of the present invention.

Moreover, the scope of the present application is not intended to be limited to the particular embodiments of the structures, methods and steps described in the specification. As one of ordinary skill in the art will readily appreciate from the disclosure of the present invention, processes, or steps, presently existing or later to be developed, that perform substantially the same function or achieve substantially the same result as the corresponding embodiments described herein may be utilized according to the present invention. Accordingly, the appended claims are intended to include within their scope such processes or steps.

What is claimed is:

1. A device comprising:
    at least two gate structures over a substrate;
    source and drain regions in the substrate on opposing sides of the at least two gate structures;
    a first gate strap electrically coupling the at least two gate structures together, the first gate strap being substantially perpendicular to the at least two gate structures;
    a first metal pattern in a first metal layer overlying the at least two gate structures and the first gate strap, the first metal pattern being electrically coupled to the at least two gate structures and the first gate strap; and
    a second metal pattern in a second metal layer electrically coupled to the source and drain regions, the second metal layer being a different metal layer than the first metal layer.

2. The device of claim 1, wherein the at least two gate structures are substantially parallel with each other.

3. The device of claim 1 further comprising a second gate strap electrically coupling the at least two gate structures together, the second gate strap being substantially perpendicular to the at least two gate structures and substantially parallel with the first gate strap, the first metal pattern being electrically coupled to the second gate strap.

4. The device of claim 1, wherein the first metal pattern is t-shaped.

5. The device of claim 1 further comprising an interlevel dielectric layer separating the first metal layer and the second metal layer.

6. The device of claim 5, wherein the second metal pattern is electrically coupled to the source and drain regions by conductive connectors, the conductive connectors comprising:
    a via extending through the interlevel dielectric layer to couple the second metal pattern to a first portion of the first metal layer; and
    a contact coupling the first portion of the first metal layer to the source and drain regions.

7. The device of claim 1, wherein the at least two gate structures comprise polysilicon.

8. The device of claim 1, wherein the second metal pattern overlaps ends of the first gate strap.

9. A device comprising:
- a first gate structure and a second gate structure over a substrate, outer sidewalls of the first and second gate structures defining a first rectangular region;
- source and drain regions in the substrate on opposing sides of the first and second gate structures;
- a gate metal pattern in a first metal layer electrically coupled to the first and second gate structures, the gate metal pattern continuously overlying the first rectangular region; and
- a source and drain metal pattern in a second metal layer electrically coupled to the source and drain regions, the second metal layer being a different metal layer than the first metal layer.

10. The device of claim 9, wherein the source and drain metal pattern is on opposing sides of the gate metal pattern.

11. The device of claim 9 further comprising:
- an interlevel dielectric layer separating the first metal layer and the second metal layer, wherein the source and drain metal pattern is electrically coupled to the source and drain regions by conductive connectors, the conductive connectors comprising:
  - a via extending through the interlevel dielectric layer to couple the source and drain metal pattern to a first portion of the first metal layer; and
  - a contact coupling the first portion of the first metal layer to the source and drain regions.

12. The device of claim 11, wherein the conductive connectors are proximate corners of the first rectangular region.

13. The device of claim 9 further comprising at least two gate straps electrically coupling the first and second gate structures and electrically coupled to the gate metal pattern.

14. The device of claim 13, wherein the at least two gate straps are substantially parallel to the first and second gate structures.

15. The device of claim 13, wherein the source and drain metal pattern overlap ends of the at least two gate straps.

16. A device comprising:
- an active area defined in a substrate;
- at least two gate structures over the active area;
- source and drain regions in the active area on opposing sides of the at least two gate structures;
- a first gate strap over the active area electrically coupling the at least two gate structures together;
- a gate metal pattern in a first metal layer overlying the at least two gate structures and the first gate strap, the gate metal pattern being electrically coupled to the at least two gate structures and the first gate strap; and
- a source and drain metal pattern in a second metal layer electrically coupled to the source and drain regions, the source and drain metal layer being a different metal layer than the first metal layer.

17. The device of claim 16, wherein the gate metal pattern overlies a central portion of the active area and the source and drain metal pattern overlies outer sides of the active area.

18. The device of claim 16, wherein the source and drain metal pattern is electrically coupled to the source and drain regions at corners of the active area.

19. The device of claim 16, wherein the at least two gate structures and the first strap are formed of a same material.

20. The device of claim 16, wherein at least two gate structures and the first strap comprise polysilicon.

* * * * *